United States Patent [19]
Miyamae et al.

[11] Patent Number: 5,818,215
[45] Date of Patent: Oct. 6, 1998

[54] DIRECT DIGITAL SYNTHESIZER DRIVEN PHASE LOCK LOOP SPECTRUM ANALYZER

[75] Inventors: Yoshiaki Miyamae, Kodama-gun; Hiroaki Takaoku, Kumagaya; Osamu Aoyama, Iwatsuki, all of Japan

[73] Assignee: Advantest Corporation, Tokyo, Japan

[21] Appl. No.: 634,429

[22] Filed: Apr. 18, 1996

[30] Foreign Application Priority Data

Apr. 21, 1995  [JP]  Japan .................................... 7-096682

[51] Int. Cl.$^6$ ................................................ G01R 13/24
[52] U.S. Cl. ................................ 324/76.27; 324/76.19
[58] Field of Search ............................ 324/76.19, 77, 324/76.27

[56] References Cited

U.S. PATENT DOCUMENTS 4,965,533  10/1990  Gilmore .................................. 331/18

FOREIGN PATENT DOCUMENTS 364771  4/1990  European Pat. Off. .

*Primary Examiner*—Vinh P. Nguyen
*Assistant Examiner*—Thomas Valone
*Attorney, Agent, or Firm*—Staas & Halsey

[57] ABSTRACT

A spectrum analyzer converts frequencies of an input signal using a local signal from a local signal generator, detects the frequency converted outputs, and sweeps the frequencies of said local signal generated by said local signal generator, to obtain a frequency-based output, wherein said local signal generator comprises a digital direct synthesizer for incrementing the output frequency for every input clock, a variable frequency oscillator for outputting an oscillation output as said local signal and a phase locked loop for controlling the oscillation frequency of said variable frequency oscillator using the output of said digital direct synthesizer as a reference signal.

4 Claims, 6 Drawing Sheets

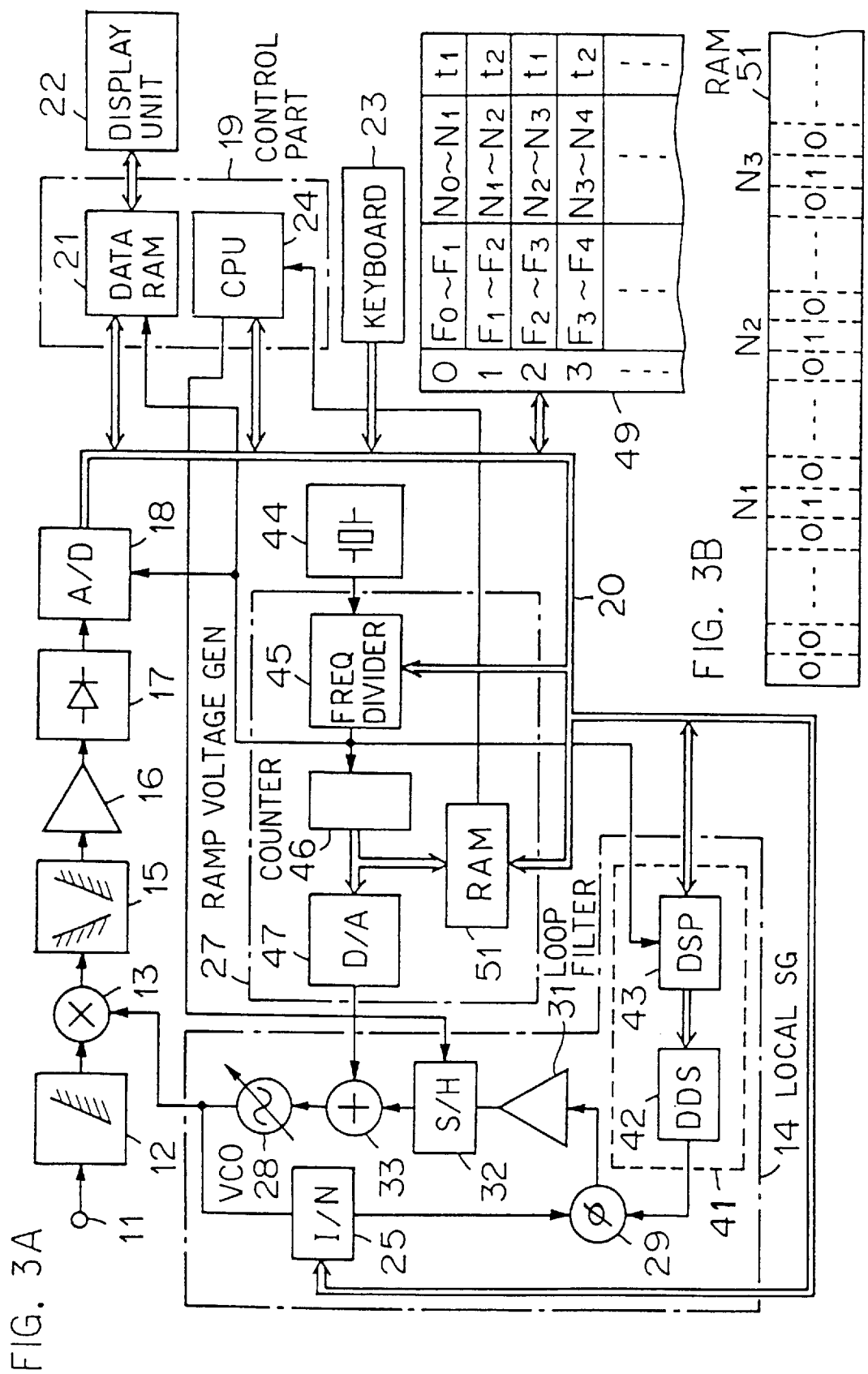

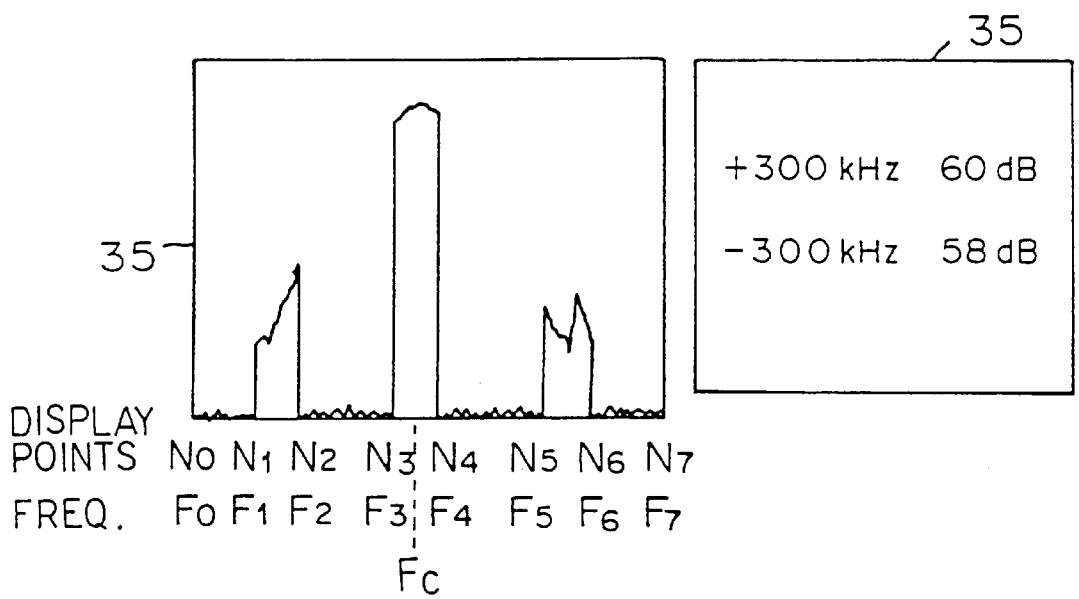
FIG. 4A
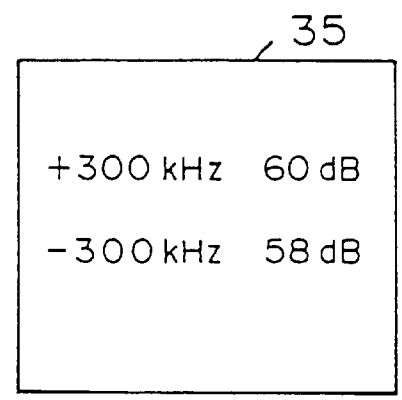
FIG. 4C
FIG 4B
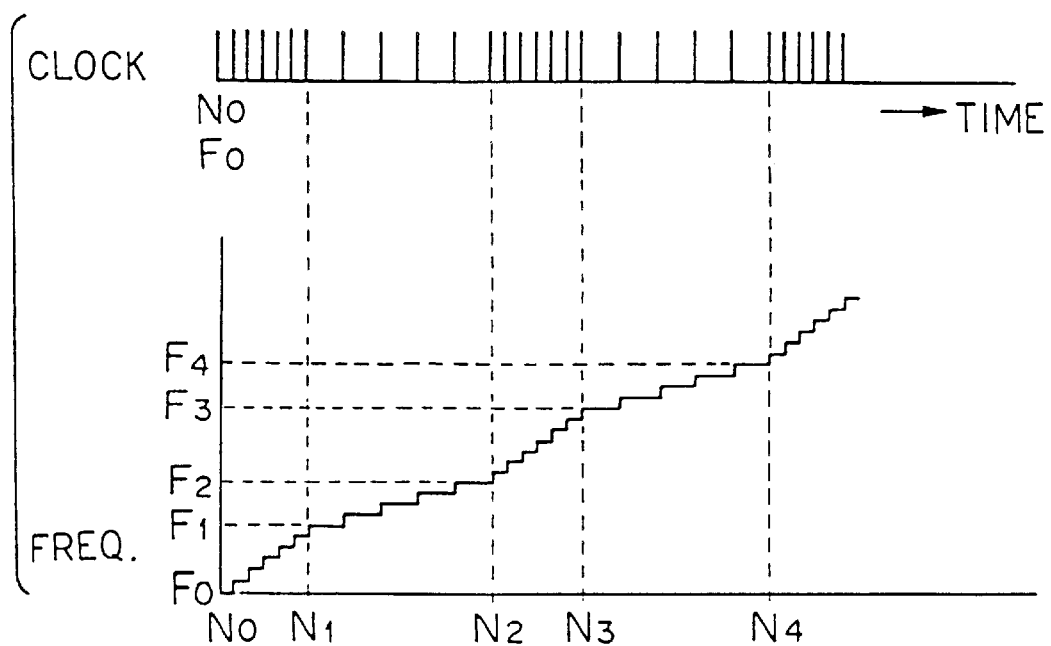

| 0 | $F_1 \sim F_2$ | $N_1 \sim N_2$ | $t_2$ |
|---|---|---|---|
| 1 | $F_3 \sim F_4$ | $N_3 \sim N_4$ | $t_2$ |
| 2 | $F_5 \sim F_6$ | $N_5 \sim N_6$ | $t_2$ |
| ⋮ | ⋮ | ⋮ | ⋮ |

DIRECT DIGITAL SYNTHESIZER DRIVEN PHASE LOCK LOOP SPECTRUM ANALYZER

BACKGROUND OF THE INVENTION

The present invention relates to a spectrum analyzer and a measuring method using the spectrum analyzer. More particularly the spectrum analyzer and the measuring method of the present invention are applied to a method for measuring, for example, frequency characteristic of a burst signal, where there are a plurality of known frequency ranges to be measured within one sweep frequency range.

FIG. 1 shows a conventional spectrum analyzer. An input signal at an input terminal 11 is supplied to a frequency mixer 13 after unnecessary high frequency components are removed by a low pass filter 12. Then, the signal supplied to the frequency mixer 13 is frequency mixed with a local signal from a local signal generator 14. An intermediate frequency component from the frequency mixer 13 is taken out by an intermediate frequency filter 15 and then is amplified in a logarithmic amplifier 16. The amplified signal is detected by a detector 17 and the detected output is converted to a digital signal by an AD converter 18. Then the digital signal is taken in a data RAM 21 within a control part 19. The data in the data RAM 21 is adjusted based on the equipment characteristic if necessary and the data is displayed on a display unit 22. Display on the display unit 22 is performed using the horizontal axis as a frequency axis, for example, 500 points, and using the vertical axis as a detection level. Data from the data RAM 21 corresponding to each point on the horizontal axis is displayed.

When a measuring frequency range is inputted from a keyboard 23, a CPU 24 of the control part 19 is connected to the AD converter 18, the data RAM 21, the keyboard 23, a frequency divider 25 and a synthesizer 26 via a bus 20. The CPU 24 sets, by its program execution, a frequency dividing ratio corresponding to the set frequency range in a variable frequency dividing circuit 25 within the local signal generator 14. The CPU 24 also sets a reference signal frequency in a frequency synthesizer 26 which comprises an analog phase locked loop and also sets a sweep speed in a ramp voltage generator 27. An oscillation signal from a variable frequency oscillator 28 in the local signal generator 14 is frequency divided by the frequency divider 25 and the divided output is compared with the reference signal from the frequency synthesizer 26 by a phase comparator 29. The phase comparison output is sampled in a sample and hold circuit 32 after passing through a loop filter 31. The oscillation frequency of the variable frequency oscillator 28 is controlled by the sampled output. When the oscillation frequency of the variable frequency oscillator 28 becomes equal to the reference signal frequency output of the synthesizer 26, the sample and hold circuit 32 holds the output at that time. The ramp voltage of the ramp voltage generator 27 is added to the held output in an adder 33. The oscillation frequency of the variable frequency oscillator 28 is controlled by the output of the adder 33. As a result, only the frequency components of the set frequency range out of the input signal from the input terminal 11 are taken out from the intermediate frequency filter 15. In such a way, in this example, the representative 500 point frequency components (levels) within the set frequency range are displayed on the display unit 22.

As a result, for example, a display as shown in FIG. 2A is displayed on a screen 35 of the display unit 22. That is, when the ramp voltage is not generated from the ramp voltage generator 27, a level of the same frequency component as the lowest frequency within the set frequency range of the input signal is displayed at the left-most position of the screen 35. At this time, the sample and hold circuit is in a hold state. The input frequencies are swept by adding the ramp voltage from the ramp voltage generator 27 to the held voltage in the adder 33. The level of each input signal frequency component is sequentially displayed from left to right on the screen 35.

In a conventional spectrum analyzer, hundred milliseconds to several seconds were required to sweep, for example, 500 point frequencies. For example, when the spectrum of a short duration burst signal 36, i.e., each frequency component, as shown in FIG. 2B is measured, an accurate measurement cannot be performed unless, the burst signals are received during a longer time than the repetition period $T_1$, the power of each frequency corresponding to each point of 500 points on the frequency axis is measured a burst by burst basis, and the measurement is performed by sequentially shifting the measuring frequency for each burst. Consequently, if the repetition period $T_1$ of the burst signal 36 is, for example, 20 ms, the time required for sweeping 500 frequency points is at least 20 ms×500=10 seconds. Such a long sweep time period becomes longer than the accuracy assured time guaranteed by the spectrum analyzer and defined based on the resolution band width (RBW), the video band width (VBW) and the. Thus a quick measurement cannot be performed.

Therefore, in the conventional system, as shown in FIG. 2C, the sweep time period within the accuracy assured time is obtained by a so-called window sweep, which a frequency sweep of in-between, for example, only 400 points on the frequency axis of the screen 35. However, in the measurement of the leakage power to the adjacent channels, the frequency components which depart on the upper side and the lower side from the carrier frequency by a frequency interval defined by a standard must be measured. In the window sweep, the defined frequency components are out of the sweep range and cannot be measured.

Incidentally, a method in which an input signal is fast Fourier transformed (FFT) and the frequency components are measured is also performed. However, in this method, the dynamic range is limited by the number of bits of the AD converter for converting the input signal to a digital signal. Therefore, the input having a large dynamic range cannot be measured in this method.

In Japanese Patent Application Laid Open No. Hei 6-331663, in order to observe at the same time a plurality of signals having frequencies apart each other by relatively large frequency intervals, a spectrum analyzer for observing a plurality of input signals having significantly different frequencies by using a DDS (a Direct Digital Synthesizer) as a local signal generator, and by sequentially switching the local signal frequency corresponding to a frequency of each signal to be received, is proposed. Since the frequency switching time can be made in less than one millisecond by the local signal generator using a DDS, a plurality of input signals in different frequency bands which are changing their levels in several hundred milliseconds can be observed at the same time.

However, this prior art method is for measuring, at the same time, the frequency of each single point apart each other by relatively large frequency interval and not for sweeping the measuring ranges apart each other by relatively large frequency intervals. Also, in this prior art method, when the input signal is a burst wave, an idea for measuring the desired frequency bands in a short time period is not shown.

It is an object of the present invention to provide a spectrum analyzer which can measure in relatively short time an input signal having frequency bands apart each other by relatively large frequency intervals and to provide a measuring method using the spectrum analyzer.

SUMMARY OF THE INVENTION

According to a method of the present invention, a plurality of frequency ranges to be measured are stored in a memory. The input signal is measured such that each measuring frequency range to be measured is sequentially frequency swept at a lower speed and each non-measuring frequency range not to be measured is swept at a higher speed.

For example, in the measurement of leakage power to adjacent channels, it is enough to measure the power of the narrow frequency range close to and including the carrier frequency and the powers of the narrow frequency ranges close to and including frequencies apart on the upper side and the lower side respectively from the carrier frequency by a pre-determined value. These frequency ranges are defined by a standard for each of the communication modes. Therefore, in the measurement of an input signal having a known measuring frequency range, the measuring frequency range is stored in a memory. Then, for the measuring frequency range, the frequency components are swept in a slower sweep speed which is slow enough for the accurate measurement, and for outside of the measuring frequency range, the frequency components are swept in a faster sweep speed than the slower sweep speed. In such a way, the sweep time period for a single sweep can be made short so that the sweep time period is shorter than the accuracy assured time defined by the standard.

In the case of a burst signal, the slower sweep speed is a speed that the measuring time for one display point on the display unit, i.e., the measuring time for a single frequency component, is equal to or longer than the repetition period of the burst signal. Also, the faster sweep speed is the maximum sweep speed available in the spectrum analyzer. Alternatively, the measuring frequency range is directly changed from one measuring frequency range to the next measuring frequency range. That is, no sweep operation is performed for non-measuring frequency ranges.

According to the spectrum analyzer of the present invention, whenever a clock is inputted to the digital direct synthesizer, the output frequency from the digital direct synthesizer is incremented. The oscillation frequency of the variable frequency oscillator is controlled by a phase locked loop using the output of the digital direct synthesizer as a reference signal. The output of the variable frequency oscillator is used as a local signal. The measuring frequency range to be measured, display point range of the screen and the sweep time period (speed) are sequentially stored in the memory. A counter counts the clock to output a display point position of the screen. Each measuring frequency range is read out from the memory by the control part. The read out measuring frequency range and the sweep time period are set in the digital direct synthesizer. When the count value of the counter becomes equal to the last display point of the read display range, the reading address of the memory is incremented by an interruption process.

The count value of the counter is converted to an analog signal. This analog signal is added to the control signal of the phase locked loop to control the variable frequency oscillator. A conventional ramp voltage generator is also provided. The variable frequency generator is controlled by both of the ramp voltage generator and the digital direct synthesizer.

In addition to the measuring frequency ranges, the ranges other than the measuring frequency ranges (non-measuring frequency ranges) within the frequency range corresponding to the entire display range of the screen, the display point ranges and the sweep time period (faster sweep speed) shorter than that of the measuring frequency range are also stored in the memory in the frequency order.

BRIEF DESCRIPTION OF THE DRAWINGS

FIG. 3A is a block diagram showing an arrangement example of a spectrum analyzer of the present invention;

FIG. 3B shows a storage example of RAM 51 in FIG. 3A;

FIG. 4A shows an example of the displayed wave form of the measured data in accordance with the present invention;

FIG. 4B shows examples of the counting clocks of the ramp voltage generator 27 and an example of the input frequency sweep;

FIG. 4C shows an example of the displayed count value of the leakage power to adjacent channels;

DESCRIPTION OF PREFERRED EMBODIMENTS

Figure 1:
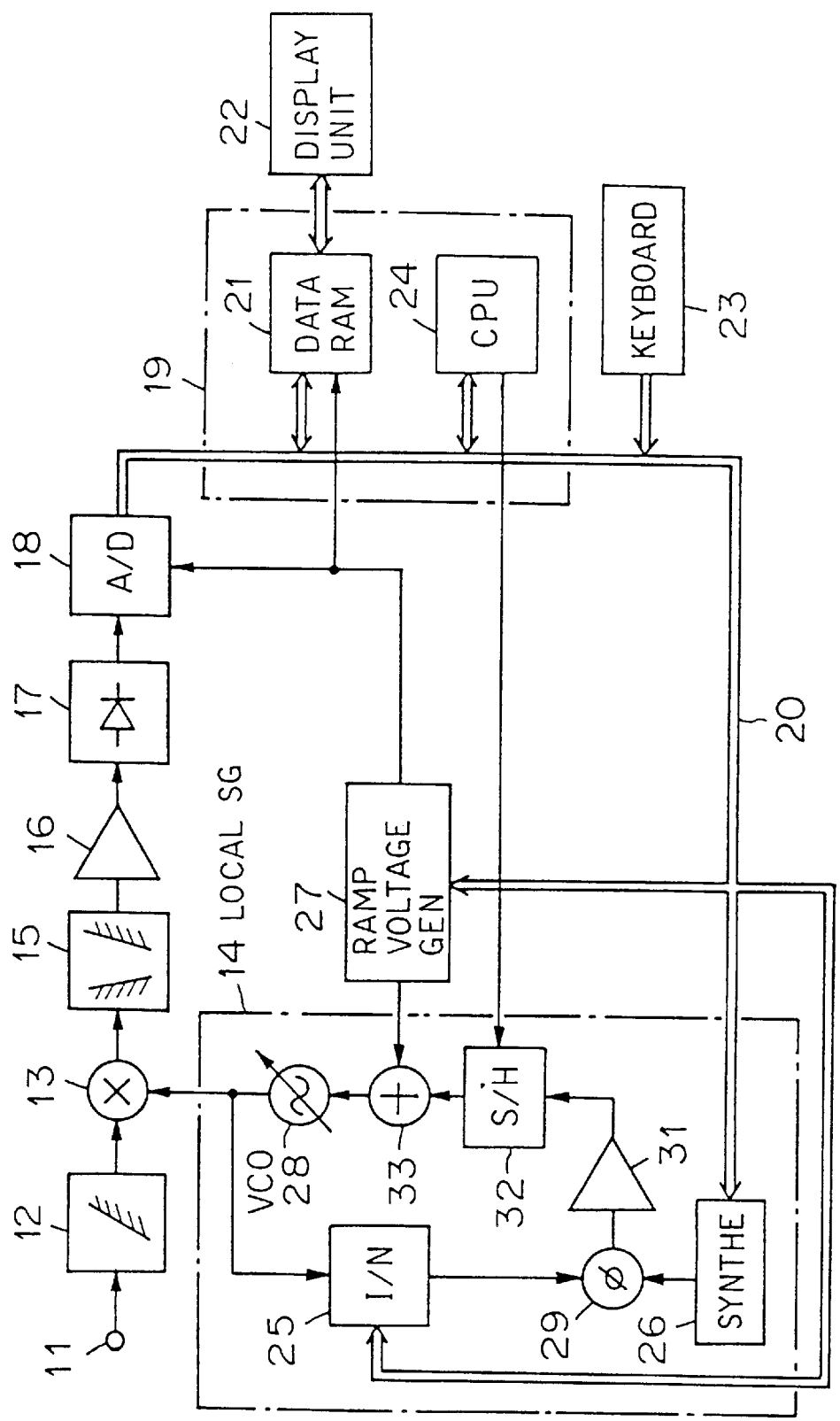
FIG. 1 is a block diagram showing a prior art spectrum analyzer.
Figure 2A:
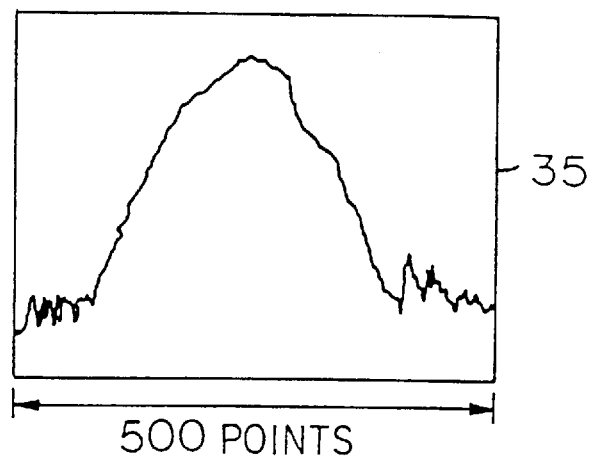
FIGS. 2A and 2C show examples of measured wave forms by the prior art spectrum analyzer.
Figure 2B:
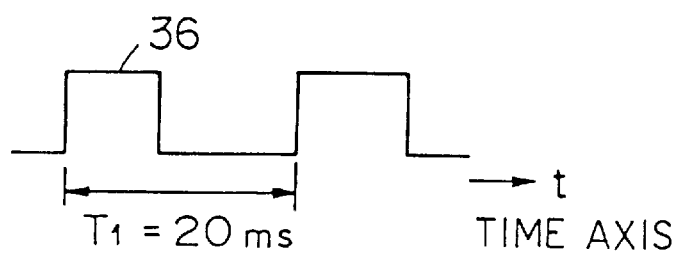
FIG. 2B shows a wave form example of a burst signal.
Figure 2C:
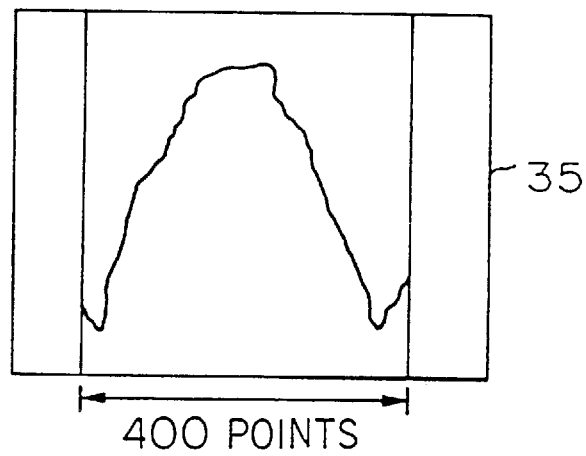

FIG. 3A shows an arrangement example of the spectrum analyzer which can perform embodiments of the spectrum analyzer of the present invention and the method using the spectrum analyzer. The same reference numerals are assigned to the portions corresponding to those in FIG. 1. In this embodiment, a digital direct synthesizer (DDS) 41 is provided as a frequency synthesizer for supplying a reference signal in a local signal generator 14. The digital direct synthesizer 41 is shown, for example, in the specification of U.S. Pat. No. 5,028,887 issued on Jul. 2, 1991. In this U.S. patent, the DDS 41 comprises a DDS main body 42 and a DSP (digital signal processor) 43 for controlling the DDS main body 42. In accordance with the frequency and the sweep time period set by a CPU 24, the starting frequency and the frequency pitch (frequency step width) are calculated by the DSP 43. The reading speed of a sine wave memory in the DDS main body 42 is varied in accordance with the calculated values. A digital sine wave read out from the sine wave memory is converted to an analog signal. The sine wave signals changing from the starting frequency step by step with the frequency pitch are outputted as the reference signals to a phase comparator 29. Sine wave signals having set frequencies may also be outputted from the digital direct synthesizer 41 without changing the frequencies step by step.

The internal arrangement of the ramp voltage generator 27 is not shown in FIG. 1. However, the ramp voltage generator 27 is substantially the same as the conventional ramp voltage generator. In the ramp voltage generator 27, a reference clock from a reference clock generator 44 is frequency divided by a programmable frequency divider 45.

The output of the frequency divider 45 is counted by a counter 46 and the count value is converted to an analog signal by a DA converter 47 and outputted as the ramp voltage. A frequency dividing ratio in accordance with the frequency sweep speed from the CPU 24 is set in the frequency divider 45.

According to this embodiment, a plurality of measuring frequency ranges, sweep time period for each of the measuring frequency ranges, frequency ranges outside of the measuring frequency ranges and sweep time periods for those frequency ranges outside of the measuring frequency ranges are set in the memory 49. These sweep time periods represent the time required for obtaining once the measured values for all the display points, 500 points in this example. That is, the sweep time periods correspond to the sweep speeds, respectively. For example, when a carrier frequency $F_c$, namely the central frequency of the input signal to be measured, and items such as leakage power to the adjacent channels are inputted from a keyboard 23, the CPU 24 executes a program for determining the measuring frequency ranges. As shown in FIG. 4A, for example, frequencies $F_1$ and $F_2$ indicating a narrow frequency range having the central frequency lower than $F_c$ by a predetermined value, frequencies $F_3$ and $F_4$ indicating a narrow frequency range having the central frequency of $F_c$, and frequencies $F_5$ and $F_6$ indicating a narrow frequency range having a central frequency higher than $F_c$ by a predetermined value are obtained by the CPU 24 and stored in the memory 49. Also as shown in FIG. 4A, frequencies $F_0$ and $F_7$ indicating the entire receiving sweep frequency range, the display positions (numbers) $N_0$–$N_7$ on the screen 35 corresponding to these frequencies $F_0$–$F_7$ a sweep time period $t_1$ corresponding to the sweep speed for outside of the measuring frequencies $F_0$–$F_1$, $F_2$–$F_3$, $F_4$–$F_5$, and $F_6$–$F_7$ ($t_1$, represents time period to sweep once all the display points, 500 points in this example), and a sweep time period $t_2$ corresponding to the sweep speed for the measuring frequency ranges $F_1$–$F_2$, $F_3$–$F_4$ and $F_5$–$F_6$ ($t_2$ represents time period to sweep once all the display points, 500 points in this example) are obtained and stored in the memory 49. In this case, $t_1$, is a value corresponding to the maximum sweep speed of the spectrum analyzer, and when the input signals are burst signals and only one frequency can be measured per burst, $t_2$ is a value obtained by multiplying the repetition period of the burst signals by the number of all the display points ($N_1$–$N_2$ plus $N_3$–$N_4$ plus $N_5$–$N_6$).

Further, in this embodiment, a RAM 51 which is read out using the count value as the address is provided in the ramp voltage generator 27. As shown in FIG. 3B, a numeric "1" is written to each of the boundary display point between the measuring frequency range and the non-measuring frequency range, that is, to each storage area of the RAM 51 to be addressed by $N_1$, $N_2$. . . or $N_6$. Also, a numeric "0" is written to each of the other storage areas of the RAM 51.

Figure 5:
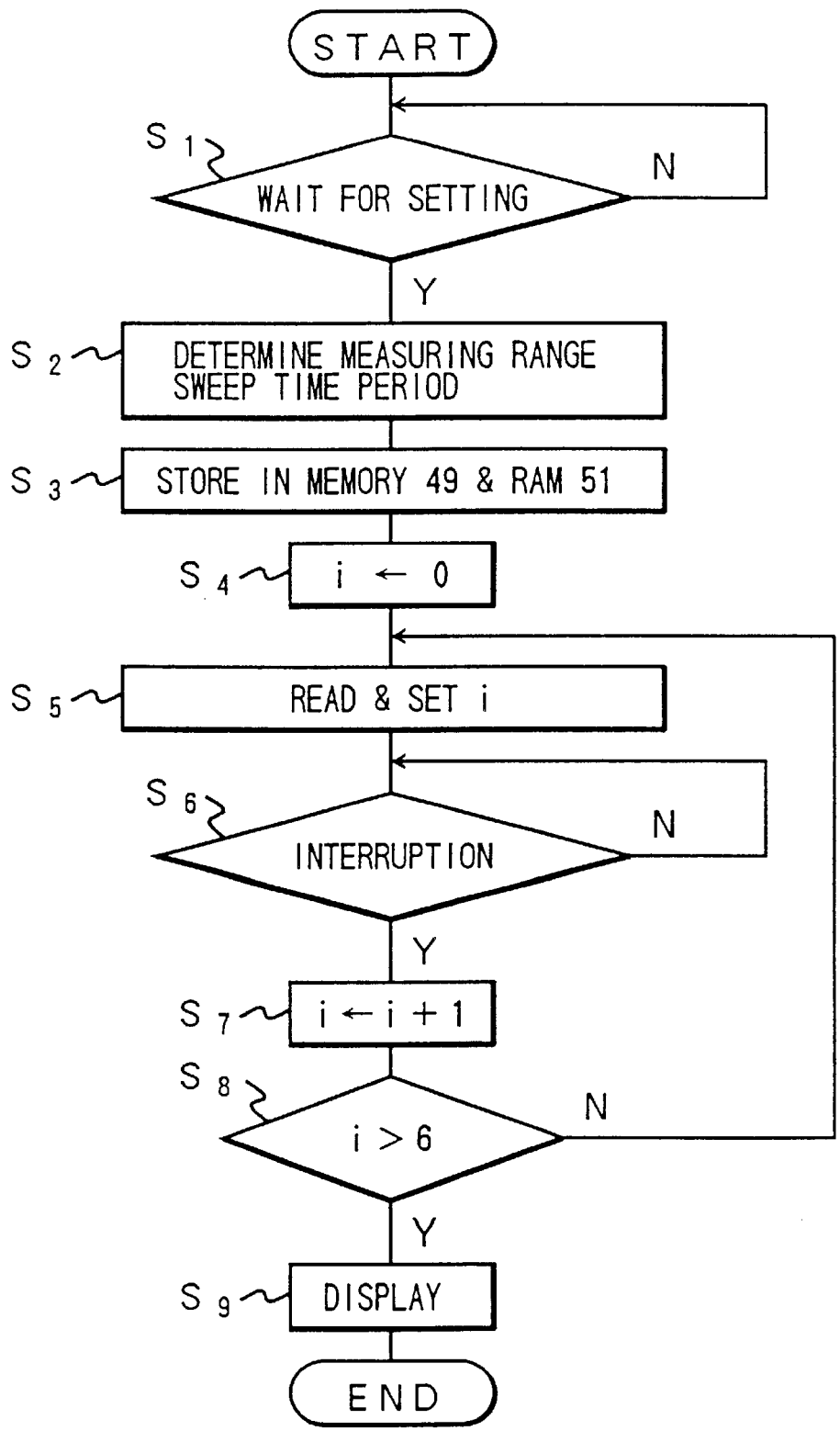
FIG. 5 shows a process sequence in an embodiment of the method of the present invention.

As shown in FIG. 5, the CPU 24 sets a carrier frequency $F_c$ and items ($S_1$). When those are set, frequencies $F_0$–$F_7$ indicating the sweep frequency range and the measuring frequency ranges, corresponding display points $N_0$–$N_7$, and the sweep time periods $t_1$ and $t_2$ for the respective non-measuring frequency range and measuring frequency range are obtained ($S_2$). Those obtained data are stored in the memory 49 for each frequency range in, for example, ascending order as shown in FIG. 3A. Also numeric "1"s are stored in the corresponding display points $N_1$–$N_6$ as shown in FIG. 3B ($S_3$). Then, zero is set to i ($S_4$). The memory 49 is read out using i as an address and the frequency dividing ratios for the respective frequency dividers 25 and 45 are set in accordance with the read frequency range and sweep time period and then, the starting frequency and the sweep time period are set in the DSP 43 ($S_5$). The DSP 43 calculates the frequency pitch (step width) in accordance with the starting frequency and the sweep time period, and sets the frequency pitch in the DDS main body 42 to make the DDS main body 42 output the signal of corresponding frequency. Based on this, a local signal having a frequency that the receiving frequency becomes $F_0$ is outputted from the local oscillator 14. The sweep time period $t_1$, in this example, indicates maximum sweep speed, and the speed of the input clock to the counter is also fast, accordingly as shown in FIG. 4B. The output clock of the frequency divider 45 is inputted to the DSP 43. The frequency of the reference signal from the DDS main body 42 is changed in the frequency pitch for each of the clock signals. Incidentally, the sample and hold circuit 32 is set such that only sampling operation is performed and holding operation is not performed.

When the display point comes to $N_1$ during the high speed sweep, "1" is read out from the RAM 51 and the "1" causes an interruption to the CPU 24. When the CPU 24 is interrupted ($S_6$), i is incremented by one ($S_7$). Then, a check is made to see if the value i has exceeded the maximum value, 6 in this example ($S_8$). If the value i has not exceeded the maximum value, then the process returns to step $S_5$ ($S_8$). By this process, the set sweep time period for the frequency divider 45 and the DSP 43 is changed to $t_2$. The sweep time period is selected such that each frequency component of the input signal can be measured accurately enough. As shown in FIG. 4B, the output clock speed of the frequency divider 45 becomes significantly slow and the frequency changing speed of the reference signal from the synthesizer 41 which changes the frequency for every clock also becomes slow. That is, a time period for receiving a set receiving frequency component becomes long enough. As mentioned above, since the sample and hold circuit 32 performs only a sampling operation and the holding function is eliminated, the oscillation frequency of the VCO 28 is set to the frequency corresponding to the reference signal frequency set by the DDS main body 42 without being influenced by the output of the DA converter 47. The reference signal frequency from the DDS main body 42 is changed for each clock of the speed in accordance with the sweep time period $t_2$, and the receiving frequencies are swept in low speed. The input signal power at each of the receiving frequencies is stored in the data RAM 21. When the frequency sweep progresses and the sweep frequency becomes the frequency corresponding to the display point $N_2$, similarly to the aforementioned case, the CPU 24 is interrupted. Then, the sweep time period is changed to $t_1$ and the sweep speed is changed to the high speed sweep. In such a way hereinafter, as shown in FIG. 4B, the sweep of the receiving frequencies is performed such that the non-measuring frequency ranges $F_0$–$F_1$, $F_2$–$F_3$, $F_4$–$F_5$ and $F_6$–$F_7$ are swept in high speed and the measuring frequency ranges $F_1$–$F_2$, $F_3$–$F_4$ and $F_5$–$F_6$ are swept in low speed. Thus the necessary frequency components are measured accurately.

When i exceeds the maximum value, 6 in this example, if the measuring item is "power leakage to the adjacent channels", the power levels of the respective frequency components within each measuring frequency range stored in the data RAM 51 are summed up and a ratio of the power of each measuring frequency range to the power of the measuring frequency range containing the $f_c$ is calculated. Then, for example, as shown in FIG. 4C, it is displayed on the screen 35 that the power of the frequency components corresponding to the range $F_5$–$F_6$ higher than the carrier frequency by 300 kHz is 60 dB and the power of the frequency components corresponding to the range $F_1$–$F_2$ lower than the carrier frequency by 300 kHz is 58 dB. If necessary, the graphic representation may be performed as shown in FIG. 4A. In this case, the non-measuring frequency ranges are swept in remarkably higher speed compared with the repetition period of the burst signal. Therefore, the receiving power in each of those frequency ranges is remarkably small.

Figures 6A, 6B:
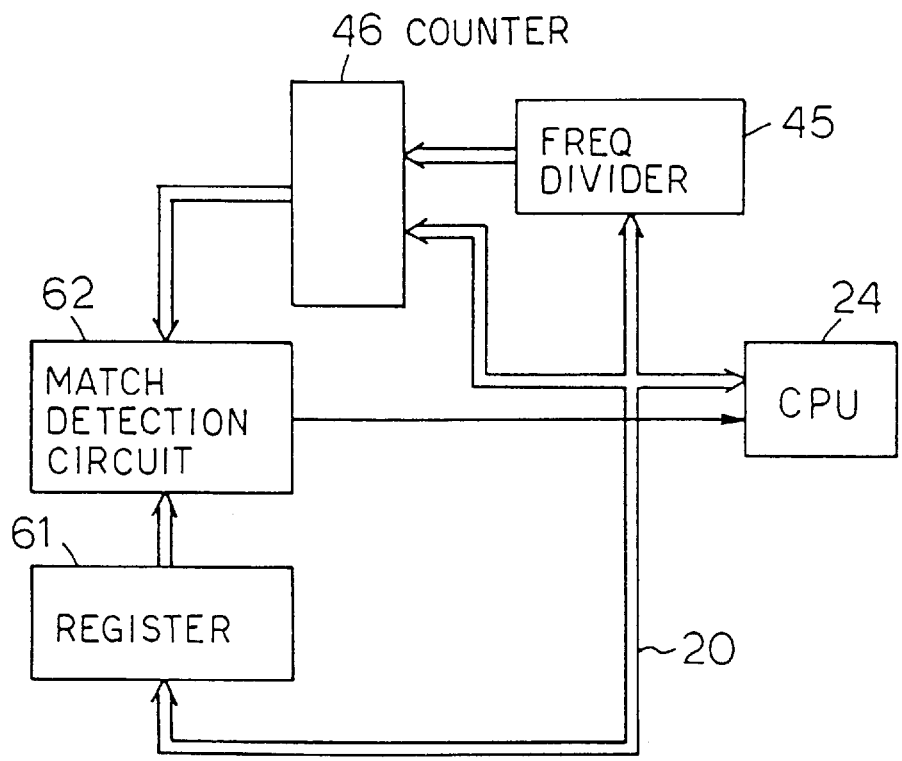
FIG. 6A shows a storage example of the memory 49 in another embodiment of the present invention.
FIG. 6B is a block diagram showing a part of another embodiment of the present invention.

In the above example, the non-measuring frequency ranges are swept in the maximum sweep speed. However, the non-measuring frequency ranges may be swept at a lower speed than the maximum speed to the extent where the entire sweep time period is shorter than the accuracy assured time defined by the spectrum analyzer and where the targeted frequency components can be measured accurately enough. Alternatively, the non-measuring frequency ranges may be skipped without being swept. That is, for example, the setting in the DSP 43 may be made such that when the receiving of the frequency $F_2$ is finished, the receiving frequency is immediately changed to $F_3$. In this case, in FIG. 3A, a numeric value can be set in the counter 46 from the control part 19. In this case, the operation is substantially same as the sequence shown in FIG. 5. When various items necessary for the measurement are set ($S_1$), the CPU 24 determines the measuring range and the sweep time period ($S_2$). The determination in this case is for only the measuring frequency ranges $F_1$–$F_2$, $F_3$–$F_4$ and $F_5$–$F_6$, and the sweep time period $t_2$. As shown in FIG. 6A, measuring frequency ranges, their display point number ranges and sweep time periods are stored in the respective storage areas in the memory 49 ($S_2$). In this case, the data on the non-measuring frequency ranges are not stored in the memory 49. With respect to the RAM 51, a numeric "1" is stored in each of $N_1$, $N_2$. . . as in FIG. 1A. Then, i is set to zero and the memory 49 is read out using i as an address, and then the respective frequency dividing ratios for frequency dividers 25 and 45 are set in accordance with the sweep time period $t_2$. The starting frequency and the sweep time period are then set in the DSP 43, and the first display point number $N_1$ within the display point range is set in the counter 46 in this case ($S_5$). Then the receiving for the measuring frequency range $F_1$–$F_2$ is started. When "1" is read out from the RAM 51 and the CPU 24 is interrupted ($S_6$), i is increment by 1 ($S_7$). Then, in this case, a check is made to determine whether i has exceeded 3 ($S_8$). If not, then the process returns to step $S_5$. Therefore, next measuring frequency range $F_3$–$F_4$ is received. The process similarly proceeds hereinafter.

In this embodiment, the sample and hold circuit 32 does not perform the hold operation.

Further, in either case for sweeping the receiving frequencies as in FIG. 3A or for sweeping the receiving frequencies as in FIG. 6A, the output of the loop filter 31 may be supplied directly to the VCO 28 omitting the sample and hold circuit, the adder 33 and the DA converter 47. However, in the case shown in FIG. 6A, as a portion is shown in FIG. 6B, the RAM 51 is omitted and a register 61 is provided. The count value of the counter 46 is compared with the stored value in the register 61 by a match detection circuit 62. When those match, the CPU 24 is interrupted. The operation of the CPU 24 is the same as explained above except that, for example, when the measuring frequency range $F_1$–$F_2$ is swept, the starting number $N_1$ of the corresponding display range $N_1$–$N_2$ is preset in the counter 46 and the ending number $N_2$ is stored in the register 61.

Incidentally, if the DA converter 47 is provided as shown in FIG. 3A, particularly when the receiving frequencies are widely changed, a larger control signal than the control signal based on the reference signal of the DDS 41 is supplied to the VCO 28 from the DA converter 47. Thus, the frequency of the VCO 28 can be matched with the set frequency quickly and accurately.

The setting of the measuring frequency ranges in the memory 49 may be performed by directly inputting $F_0$–$F_7$ from the keyboard 23 rather than determining $F_0$–$F_7$ by the CPU 24. In FIG. 3A, as indicated by a dotted line, the count value of the counter 46 is supplied to the DA converter 47 and the RAM 51 in different manner. The maximum count value of the counter 46 is made larger, for example 2–3 times, than the number of display points of the screen 35 (500 in the above example). The count value of the counter 46 supplied to the RAM 51 is equal to the number of display points (500 in the above example) of the screen for one sweep period, but the count value of the counter 46 supplied to the DA converter 47 is, for example, twice (1000 in the above example) for one sweep period. Thus, the count value for the DA converter 47 changes 2–3 times faster than count value for the RAM 51. Consequently, the sweep resolution of the receiving frequencies could be increased. That is, out of the bits of the count value of the counter 46 supplied to the DA converter 47, the upper bit portion is supplied to the RAM 51. At this time, the increment of the output frequency of the DDS 41 is performed in higher speed than the increment speed of the count value supplied to the RAM 51. In this case, the relationship between the count value for the DA converter 47 and the count value for the RAM 51 can be changed by the CPU 24. Incidentally, the sweep of the wide frequency range, for example, 5 MHz in base band frequency width, may be difficult for the DDS main body 42 to handle. In such a case, a constant frequency reference signal is outputted from the digital direct synthesizer 41. In this state, after the control to the VCO 28 is stabilized, the sample and hold circuit 32 is placed in the hold state, and then the frequency sweep is performed using only the ramp signal from the ramp voltage generator 27.

As mentioned above, according to the present invention, the measuring frequency range is swept slowly and the non-measuring frequency range is swept quickly or skipped. Therefore, the targeted frequency components can accurately be measured within the accuracy assured time defined by a spectrum analyzer.

If the non-measuring frequency range is swept in the maximum sweep speed of the spectrum analyzer, the data acquisition to the data RAM 21 can be made for the entire sweep range. Therefore, the conventional processing program can be utilized with small changes. When the non-measuring frequency range is skipped, the data acquisition to the data RAM 21 is not performed in the non-measuring frequency range. Therefore, the respective data for the measuring frequency ranges $N_1$–$N_2$, $N_3$–$N_4$ and $N_5$–$N_6$ are written in packed form from the address $N_0$ in the data RAM 21. Consequently, the correlations between the frequencies and the display points are lost. Thus, the conventional processing program cannot be used. However, if the non-measuring range is swept in the maximum sweep speed, the data acquisition is performed even for the non-measuring frequency range, and thus, such a problem can be eliminated.

Since the VCO 28 is also controlled by the ramp voltage from the ramp voltage generator in addition to the frequency sweep by the digital direct synthesizer 41, the output variance of the phase comparator 29 is small compared with the case in which the frequencies are changed by the digital direct synthesizer 41 only. Consequently, the frequency of the VCO 28 can quickly be locked with the set frequency.

We claim:

1. A spectrum analyzer which converts frequencies of an input signal using a local signal from a local signal generator, detects frequency converted outputs, and sweeps the frequencies of said local signal generated by said local signal generator, to obtain a frequency based output, wherein said local signal generator comprises a digital direct synthesizer incrementing the output frequency for every input clock, a variable frequency oscillator outputting an oscillation output as said local signal and a phase locked loon controlling the oscillation frequency of said variable frequency oscillator using the output of said digital direct synthesizer as a reference signal, said spectrum analyzer comprising:

- a memory sequentially storing measuring frequency ranges to be measured, display point ranges on a screen, and sweep time periods;
- a counter counting said clock to output display point positions of the screen;
- control means for reading said memory for every measuring frequency range, for setting the measuring frequency ranges and the sweep time periods in said digital direct synthesizer, and for advancing the reading address of said memory when the count value of said counter becomes the end point of said read display point range;
- a DA converter converting the count value of said counter to an analog signal;
- an adder adding the output analog signal of said DA converter to a control signal for said variable frequency oscillator of said phase locked loop to supply to said variable frequency oscillator;
- a variable frequency divider frequency dividing a reference clock by a dividing ratio set by said control means; and
- a RAM read using the count value of said counter as an address, and storing a bit indicating each of a starting point and an ending point of each said display point range in an address portion corresponding to each of said starting point and said ending point;
- wherein non-measuring frequency ranges, corresponding display point ranges and a shorter sweep time period than said sweep time period for outside of said measuring frequency ranges are stored in said memory in the frequency order for both of said non-measuring frequency ranges and said measuring frequency ranges, and when said bit indicating the starting point and the ending point is read from said RAM, said control means is interrupted and said control means sequentially reads out said memory to set said frequency range and said sweep time period in said digital direct synthesizer and to set a frequency dividing ratio in said frequency divider in accordance with the read out sweep time period and wherein a lower byte lower than the byte supplied to said RAM is provided in said counter and the count value of said counter is supplied to said DA converter including said lower byte.

2. The spectrum analyzer according to claim 1, wherein a register storing the ending point of said read out display point range and a match detection circuit detecting the matching of the stored value of said register and the count value of said counter to interrupt to said control means are provided, and the starting point of the read out display point range is preset in said counter.

3. A spectrum analyzer which converts frequencies of an input signal using a local signal from a local signal generator, detects frequency converted outputs, and sweeps the frequencies of said local signal generated by said local signal generator, to obtain a frequency based output, wherein said local signal generator comprises a digital direct synthesizer incrementing the output frequency for every input clock, a variable frequency oscillator outputting an oscillation output as said local signal and a phase locked loop controlling the oscillation frequency of said variable frequency oscillator using the output of said digital direct synthesizer as a reference signal, said spectrum analyzer comprising:

- a memory sequentially storing measuring frequency ranges to be measured, display point ranges on a screen, and sweep time periods;
- a counter counting said clock to output display point positions of the screen; and
- control means for reading said memory for every measuring frequency range, for setting the measuring frequency ranges and the sweep time periods in said digital direct synthesizer, and for advancing the reading address of said memory when the count value of said counter becomes the end point of said read display point range, wherein the number of said measuring frequency ranges is 3 and means for calculating and displaying the power ratios of the respective powers of the measuring frequency ranges of both sides to the power of the central measuring frequency range is included.

4. The spectrum analyzer according to claim 1, comprising:

- input means coupled to said control means, and
- means for obtaining said frequency ranges in accordance with an input when a central frequency and measuring items are inputted as said input to said input means, and for storing said frequency ranges in said memory.

* * * * *

UNITED STATES PATENT AND TRADEMARK OFFICE
CERTIFICATE OF CORRECTION

PATENT NO.   : 5,818,215
DATED        : October 6, 1998
INVENTOR(S)  : Miyamae et al.

It is certified that error appears in the above-identified patent and that said Letters Patent is hereby corrected as shown below:

Col. 1,   line 9, "particularly" should be --particularly,--.

Col. 2,   line 18, "measured" should be --measured on--.

Col. 2,   line 30, "which" should be --which is--.

Col. 4,   line 28, begin "FIG. 6A" with a NEW PARAGRAPH;

Col. 5,   line 8, "period" should be --periods--;
          line 32, "$F_7$" should be --$F_7$,--;
          line 63, "Also" should be --Also,--.

Col. 9,   line 10, "loon" should be --loop--.

Signed and Sealed this

Fourth Day of May, 1999

Attest:

Attesting Officer

Q. TODD DICKINSON

Acting Commissioner of Patents and Trademarks